(12) United States Patent
Wengerter et al.

(10) Patent No.: US 7,688,900 B2
(45) Date of Patent: *Mar. 30, 2010

(54) INTERLEAVER DECORRELATION IN DATA TRANSMITTING AND RECEIVING DEVICES

(75) Inventors: Christian Wengerter, Kleinheubach (DE); Alexander Golitschek Edler Von Elbwart, Darmstadt (DE); Eiko Seidel, Darmstadt (DE)

(73) Assignee: Panasonic Corporation, Osaka (JP)

( * ) Notice: Subject to any disclaimer, the term of this patent is extended or adjusted under 35 U.S.C. 154(b) by 992 days.

This patent is subject to a terminal disclaimer.

(21) Appl. No.: 10/259,799

(22) Filed: Sep. 30, 2002

(65) Prior Publication Data

US 2003/0076873 A1 Apr. 24, 2003

(30) Foreign Application Priority Data

Oct. 10, 2001 (EP) .................................. 01124164

(51) Int. Cl.
*H04K 1/00* (2006.01)
(52) U.S. Cl. ............... 375/260; 375/295; 375/316; 375/141; 375/299; 375/347; 370/320; 370/335; 370/342
(58) Field of Classification Search ............... 375/260, 375/285, 295, 316, 141, 299, 347; 370/335, 370/320, 342
See application file for complete search history.

(56) References Cited

U.S. PATENT DOCUMENTS

| | | | |
|---|---|---|---|
| 5,056,105 A | | 10/1991 | Darmon et al. |
| 6,130,884 A | * | 10/2000 | Sato ........................ 370/335 |
| 6,154,452 A | | 11/2000 | Marko et al. |
| 6,311,075 B1 | * | 10/2001 | Bevan et al. .............. 455/562.1 |
| 6,463,080 B1 | * | 10/2002 | Wildey ........................ 370/508 |
| 6,668,023 B1 | * | 12/2003 | Betts .......................... 375/285 |
| 6,671,851 B1 | * | 12/2003 | Moulsley ................... 714/790 |
| 6,687,870 B1 | * | 2/2004 | Mohseni et al. ............ 714/762 |
| 6,721,908 B1 | * | 4/2004 | Kim et al. ................... 714/702 |
| 6,963,532 B1 | * | 11/2005 | Dent .......................... 370/208 |

(Continued)

FOREIGN PATENT DOCUMENTS

EP 0881795 12/1998

(Continued)

OTHER PUBLICATIONS

Salah et al. "A general interleaver for equal and unequal error protections of turbo codes with short frames", Information Technology: Coding and Computing, 2000. Proceedings. International Conference on Mar. 27-29.*

(Continued)

*Primary Examiner*—Mohammad H Ghayour
*Assistant Examiner*—Leila Malek
(74) *Attorney, Agent, or Firm*—Dickinson Wright PLLC

(57) ABSTRACT

A data transmitting device for transmitting data on a channel within a CDMA system may simultaneously convey data with a plurality of other data transmitting devices on one channel. The data transmitting device includes an interleaver that receives an interleaver pattern parameter, generates a respective interleaver pattern in accordance with the received parameter, and interleaves a source data stream using the generated interleaver pattern to produce an interleaved data stream. The generated interleaver pattern has interleaver characteristics that differ from the interleaver characteristics of at least one other data transmitting device that simultaneously transmits data on the channel.

10 Claims, 4 Drawing Sheets

U.S. PATENT DOCUMENTS

| 7,230,995 B2 * | 6/2007 | Wengerter et al. ........... 375/295 |
|---|---|---|
| 2001/0038663 A1 * | 11/2001 | Medlock ...................... 375/142 |
| 2002/0149496 A1 * | 10/2002 | Dabak et al. ........... 340/825.56 |
| 2002/0172292 A1 * | 11/2002 | Gray ........................... 375/259 |
| 2002/0174401 A1 * | 11/2002 | Wang et al. .................. 714/786 |
| 2002/0196861 A1 * | 12/2002 | Tzannes et al. ............. 375/261 |

FOREIGN PATENT DOCUMENTS

| EP | 0892501 | 1/1999 |
|---|---|---|
| JP | 7202851 | 8/1995 |
| JP | 11215091 | 8/1999 |
| KR | 2001075830 | 8/2001 |
| WO | 0060750 | 10/2000 |

OTHER PUBLICATIONS

Y Li et al., Near Capacity multiple Access Scheme for Inteeference Channel Using Complex-valued signals Electronics Letter, IEE Stevenage, vol. 34, No. 22, XP006010518, pp. 2096-2097, Oct. 29, 1998.*

A. Elezabi, et al., "Two-Stage Detection of Coded CDMA Systems and a Novel Interleaving Scheme," 0-8186-7852-6/97, pp. 551-555, IEEE 1997.

W. T. Sang, et al.,"Combined Coding and Successive Interference Cancellation with Random Interleaving for DS/CDMA Communications," XP-000922422, pp. 1825-1829, IEEE 1999.

Chinese Office Action dated Jul. 9, 2004 with English translation.

European Search Report dated Jan. 19, 2005.

Y. Li, et al., "Near Capacity Multiple Access Scheme for Interference Channel Using Complex-Valued Signals," Electronics Letter, IEE Stevenage, vol. 34, No. 22, XP006010518, pp. 2096-2097, Oct. 29, 1998.

* cited by examiner

INTERLEAVER DECORRELATION IN DATA TRANSMITTING AND RECEIVING DEVICES

FIELD OF THE INVENTION

The invention relates to a data transmitting device for transmitting data on a channel, and to a corresponding data receiving device, and in particular to devices that interleave and deinterleave data streams. The invention is in particular suitable for use with PN interleavers

BACKGROUND OF THE RELATED ART

It is well known in the art to employ interleavers to obtain some limited form of time diversity, particularly for wireless communications systems which suffer from signal fading effects due to the variance of the radio channel characteristics. An example of a communication system in which transmitters and receivers interleave and deinterleave data, respectively, is depicted in FIG. 1.

In FIG. 1 a transmitter 100, 110, 120, 130 transmits data on a channel 140 to a receiver 150, 160, 170, 180. The transmitter obtains data from signal source 100, and this data then undergoes forward error correction (FEC) which is done by FEC encoder 110, so that convolutional codes or codes derived therefrom are obtained. The output of the FEC encoder 110 is forwarded as source data stream to the interleaver 120.

Interleavers, also known as permuters, are used for minimising the effect of noise bursts and fading in a data transmission system. An interleaver is generally implemented using a block structure or a convolutional structure. Variations of block interleavers are also used in communication systems. Other interleavers include S-Random Interleaver, Dithered-Golden Interleaver, Pseudo-Noise (PN) Interleaver, etc.

A block interleaver formats the encoded data in a rectangular array. Usually, each row of the array constitutes a code word or vector of a length that corresponds to the number of columns. The bits are read out column-wise and transmitted over the channel. At the receiver, the deinterleaver stores the data in the same rectangular array format, but it is read out row-wise, one code word at a time. As a result of this reordering of the data during transmission, a burst of errors is broken down into a number of bursts, which number corresponds to the number of rows in the rectangular array during encoding. Other implementations of block interleavers exist such as those which use only one vector.

A convolutional interleaver can be used in place of a block interleaver in much the same way.

The process of interleaving and the actual interleaver functionality will be better understood considering the following example. Assuming that the source data stream which is submitted to the interleaver is an input sequence $x_k$, the function of the interleaver can be described as permuting the input sequence $x_k$ to an output sequence $y_k$ according to $$y_k = x_{f(k)},$$

where f(k) is a permutation function that might for instance be $$f(k) = 1 + [(7*k) \bmod 54]$$

with k running from 1 to 54, and where 54 is, in the present example, the length of one code block. Applying this example function, the input sequence would be mapped to an output sequence according to $(y_1\ y_2 \ldots y_{54}) = (x_8\ x_{15}\ x_{22}\ x_{29}\ x_{36}\ x_{43}\ x_{50}\ x_3\ x_{10}\ x_{17} \ldots x_{41}\ x_{48}\ x_1)$.

The conventional interleaving techniques are especially disadvantageous in communication systems where data of a plurality of different transmitters is simultaneously conveyed on one channel. This is depicted in more detail with reference to FIG. 2.

Referring to the figure, there are three transmitting devices shown that transmit data on the same channel 140. The individual transmitters are of essentially the same construction but transmit data from different signal sources 200, 210, 220. Each of the data from the individual signal sources are first FEC encoded in the respective encoder 110, and are then interleaved by interleaver 230 before being modulated by modulator 130.

The transmission scheme depicted in FIG. 2 is disadvantageous because there is some form of interference between the multiple data streams which negatively affects the system performance. This is since the multiple data streams that share the same radio resource simultaneously, do not fulfil the general requirement of perfect orthogonatility. In particular, the interference can produce burst errors that can render the transmitted data unreadable to the respective receivers.

SUMMARY OF THE INVENTION

It is therefore the object of the invention to provide a data transmitting device and a data receiving device having reduced inter-stream interference.

This object is solved by the invention as claimed in the independent claims.

The invention provides a data transmitting device for transmitting data on a channel. The device is operable in a communication system that can simultaneously convey data of a plurality of data transmitting devices on one channel. The device comprises an interleaver for interleaving a source data stream, thereby generating an interleaved data stream. Further, means for transmitting said interleaved data stream on said channel is provided. The interleaver characteristics differ from interleaver characteristics of at least one other data transmitting device that simultaneously transmits data on the channel. The invention further provides a corresponding data receiving device. The invention further provides a corresponding data receiving device. By decorrelating the interleavers and deinterleavers for synchronised data transmission, the invention reduces inter-stream interference.

According to an embodiment of the invention, each interleaver uses an interleaver pattern that differs from the interleaver patterns used simultaneously by the other transmitters that transmit data on the same channel. Interleaver patterns are well known in the art as describing the characteristics of the interleaver. For instance, in the permutation example above, the interleaver patter corresponds to the function f(k). A channel is any physical or logical entity that is used for conveying data of different transmitters in such a way that interference can occur.

By using distinct interleaver patterns for each of a plurality of data transmitting devices, inter-stream burst errors are transformed into a multitude of either short burst errors or single errors. Thus, the invention is particularly advantageous when burst errors are the result of the inter-stream interference.

This is because generally, interference between streams is more or less bursty in nature, i.e. it results in blocks of errors of a length of more than one information unit. By transforming the burst interference into a multitude of shorter errors, the invention improves over the system depicted in FIG. 2 as it allows to decorrelate the interleavers. In the conventional system, all data streams use identical interleavers and FEC codes. If some error pattern occurs that cannot be corrected by the FEC decoder, this will happen to all data streams since the error pattern will also be identical, i.e. fully correlated. By using different interleavers, the error patterns are decorrelated so that in some of the data streams the error pattern still cannot be corrected while in other data streams that have different error patterns, correction can be successfully done. Thus, the invention advantageously increases the system performance.

Moreover, the invention improves over the conventional FEC schemes because these techniques are either designed to be most effective for single errors (e.g. convolutional code, turbo code) or burst errors (e.g. Reed-Solomon code). In contrast thereto, the invention advantageously allows to distribute the occurring burst errors into a sequence of smaller bursts or single errors.

Furthermore, the invention can easily be implemented in transmitters and receivers, in particular when the interleaver functionality is constant over time. However, the invention can also be used with interleaver functionalities that vary with time if this should be necessary from a communication system's design point of view. Thus, the invention can be easily adapted to different system designs in a flexible manner.

The invention is in particular suitable for HSDPA (High-Speed Downlink Packet Access) with multi-code transmission within the 3GPP ($3^{rd}$ Generation Partnership Project) context because error decorrelation using distinct interleaver patterns is particularly applicable in systems where the data streams do not differ from each other with respect to any other parameter such as the code block length, spreading factor, coding rate etc.

The invention will also have beneficial effects on interference rejection or interference cancellation techniques without affecting their structure. With these schemes at some points an estimate is formed on the transmitted data. Again, if for instance convolutional FEC codes are used, if there is a wrong estimate, this is most probably of bursty nature. Thus, the provision of distinct interleavers according to the invention will also enable the decorrelation of the mentioned bursty wrong estimates which are then less harmful to the FEC decoder.

The invention is in particular applicable to Direct-Sequence CDMA (Code Division Multiple Access) systems like UMTS (Universal Mobile Telephone Service) which is a third generation (3G) mobile system being developed by ETSI within the ITU's IMT-2000 framework.

Preferred embodiments of the invention are defined in the dependent claims.

BRIEF DESCRIPTION OF THE DRAWINGS

The invention will now be described in more detail with reference to the accompanying figure drawings in which.

DETAILED DESCRIPTION OF THE INVENTION

Preferred embodiments of the invention will be described in more detail with reference to the figure drawings wherein like elements are identified by like reference numbers.

Figure 3:
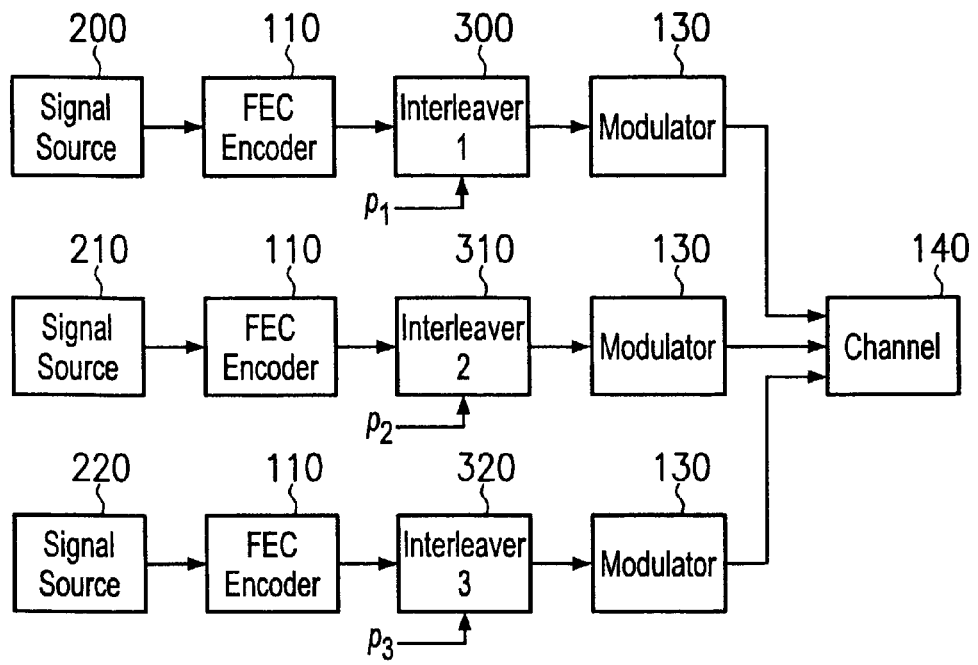
FIG. 3 illustrates the transmitter side of a communication system according to a preferred embodiment of the present invention.

Referring now to FIG. 3, the invention will be described discussing the transmission side of the communication system. The receiver side will not be discussed in detail in order to not unnecessarily obscure the invention. Knowing how the invention works on the transmitter side will enable the skilled person to design the receiver side in a very straight forward way by providing the corresponding inverse counterparts of the individual units found on the transmitter side.

As shown in FIG. 3 each data transmitting device that transmits data on the same channel 140 includes an interleaver 300, 310, 330 that is distinct, i.e. the interleavers differ from each other in the respective interleaver pattern used. As will be discussed in more detail below, in preferred embodiments of the invention the interleavers 300, 310, 320 each receive a parameter $p_i$, i=1, 2, 3, that is used for generating the respective interleaver pattern.

There are a number of different possible ways of how to obtain distinct interleaver patterns from these parameters.

One way of generating interleaver patterns is to modify a given mother interleaver pattern. Before the interleaver can start, an input vector of length N has to be available at the input of the interleaver, i.e. N symbols are required to be input. For the purpose of describing the invention, the term symbol refers to any data element or data unit that can be used for dividing a vector. N denotes the interleaver length and is a parameter given by the communication system to which the interleaver is applied. The invention preferably makes use of interleaver lengths of at least two.

The modification of the mother interleaver pattern is done by applying an algorithm that depends on the respective interleaver parameter $p_1$. A preferred embodiment of such an algorithm is the cyclic shifting of the input sequence of symbols. This will now be discussed with reference to FIG. 4.

Figure 4:
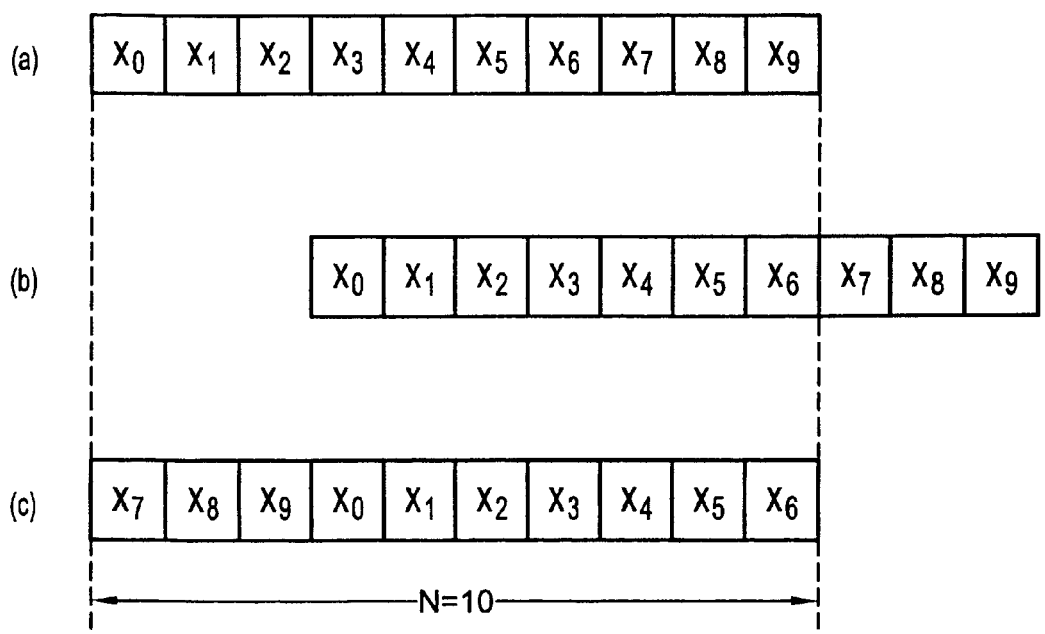
FIG. 4 illustrates the cyclic shifting scheme of a preferred embodiment of the present invention.

Assuming the source data stream consists of a sequence of symbols having positions $x_k$, k=0, . . . , N−1, the data stream undergoes the "cyclic shifting" procedure before interleaving. For this purpose, a cyclic shifting parameter π is introduced for each transmitter i, $$p_i = \pi_i,$$

which shifts the input by π positions in a cyclic fashion which means that within each vector, a bit position of greater than N is wrapped around to an equivalent position in the same vector. In the example of FIG. 4, the value of N is 10 and the cyclic shifting parameter π is equal to 3. Starting from sequence (a) of FIG. 4, the symbols are shifted by three to the right to obtain the sequence (b), and symbols $x_7$, $x_8$ and $x_9$ are wrapped around to obtain the sequence depicted in (c) of FIG. 4. It should be understood that the intermediate sequence (b) is shown in the figure for explanation reason only, as the sequence (c) can be obtained from the starting sequence (a) in a one-step operation.

Thus, the input symbol position has changed from $x_k$ to $x'_k$ according to $$x'_k = [x_k + \pi] \bmod N$$

where mod is the well known modulo function. It will be appreciated that the relation is identical for any value of π that is offset by N. Therefore, the range for varying the parameter π can be set, without loss of generality, to the integer number range starting from 0 and running to N−1.

When identical mother interleaver patterns are used, a total of N different interleaver patterns can be obtained. Moreover, it will be appreciated that setting the interleaver parameter π to 0 results in using the mother interleaver pattern itself.

While the cyclic shifting scheme shown in FIG. 4 has been discussed as being performed on the source data stream before interleaving, it will be appreciated that the scheme can also be applied to the output sequence. Assuming that the output sequence symbol positions $y_k$ are obtained from the input symbol positions $x_k$ according to $$y_k = f(x_k)$$

where the function f describes the characteristics of the mother interleaver, the cyclic shifting of the output sequence can be described by $$y_k = [f(x_k) + \pi] \bmod N.$$

In another preferred embodiment of the present invention, the cyclic shifting scheme is performed both on the input sequence and the output sequence. This leads to a higher flexibility in choosing the distinct interleavers, and thus to a higher number of possible distinct interleavers to be used or chosen.

It will be appreciated that when the cyclic shifting scheme is performed both before and after the interleaving process, the algorithms can run completely separately from each other but can in an alternative approach also use the same parameters. Therefore, in one embodiment the interleaver parameters $p_1$, i=1, 2, 3, are used for both cyclic shifting processes in the same manner whereas in another preferred embodiment the parameters $p_i$, i=1, 2, 3, are actually tuples containing two different values, one being used for cyclic shifting the input sequence and the other being used for cyclic shifting the output sequence:

$$p_1 = <\pi^{in}, \pi^{out}>_1.$$

Due to the combination of different algorithms, different interleaver pattern tuples might lead in certain combinations to an identical interleaver behaviour for different streams. These cases depend on the parameter N which is a parameter given by the system. The selection of interleaver pattern parameters is therefore preferably done by avoiding those tuples which lead to identical interleavers. When it is determined that a parameter tuple is given that tends to result in an identical interleaver behaviour for different streams, this tuple is exchanged by another tuple.

Another embodiment of how to obtain distinct interleaver patterns from a mother pattern is the biased mirroring scheme which will now be discussed with reference to FIGS. 5 and 6.

Mirroring itself would result in a process which can be achieved by simply reversing the order of the positions, i.e.

$$x'_k = (N-1) - x_k.$$

In order increase the variability, a centre position parameter γ is introduced for each transmitter i:

$$p_i = \gamma_i.$$

The parameter γ is an integer multiple of 0.5. It acts as the mirroring point if it is an integer number, or it gives the mirroring centre between two positions [γ−0.5; γ+0.5] if it is not an integer number. Since the mirroring position is now no longer the centre of the vector, the present mirroring scheme is called "biased mirroring".

Figure 5:
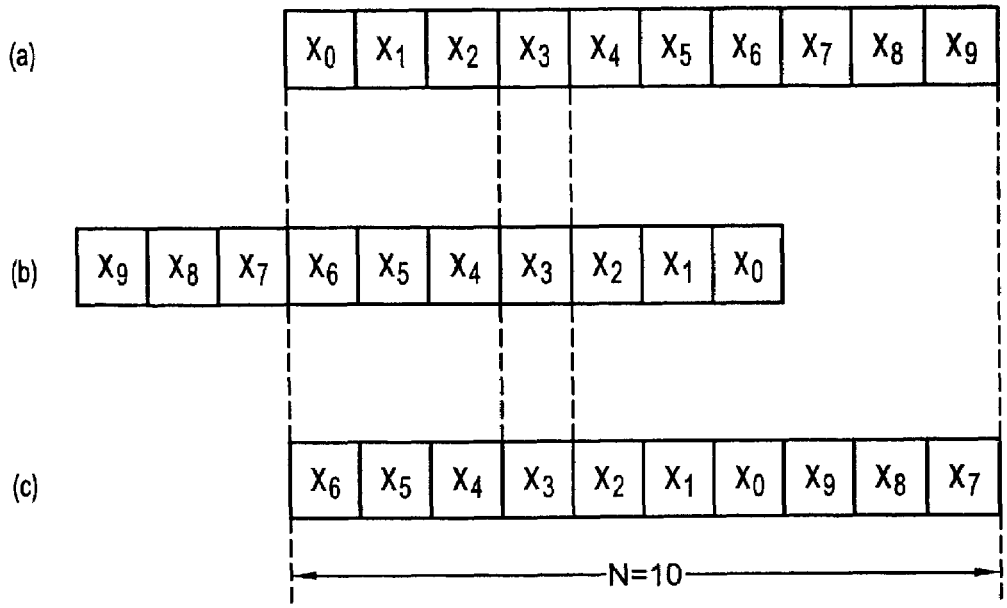
FIG. 5 depicts a biased mirroring scheme of the present invention having an integer mirror position.
Figure 6:
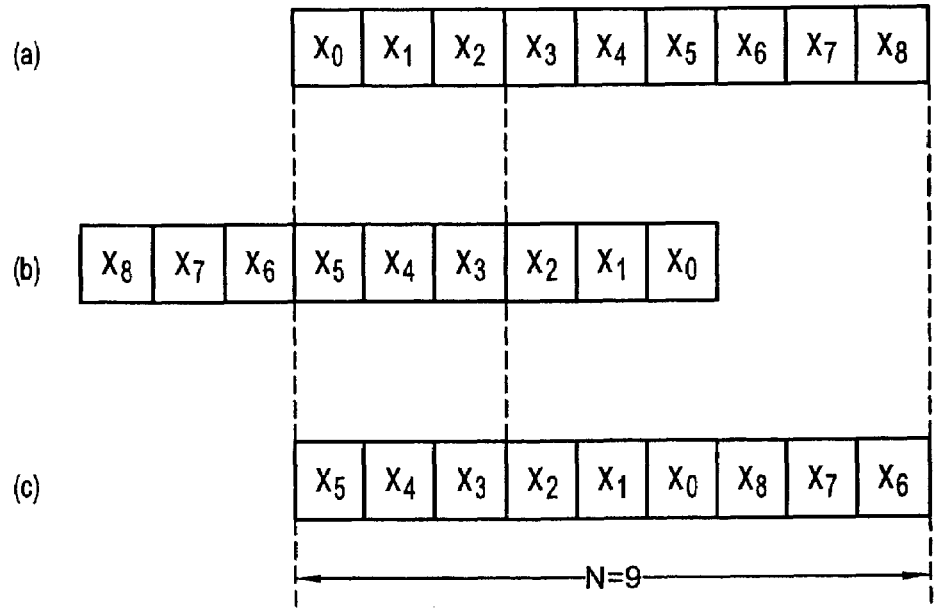
FIG. 6 illustrates another biased mirroring scheme of the present invention where a fractional mirror position is used.

FIG. 5 depicts the biased mirroring scheme where the centre position parameter γ is an integer number. In the example of FIG. 5, γ is equal to 3. In a first step, the sequence is mirrored to obtain the sequence of (b) of FIG. 5, and the symbol positions $x_9$, $x_8$ and $x_7$ are then wrapped around to obtain sequence (c). In the example of FIG. 6, the centre position parameter γ is equal to 2.5 so that a mirroring axis is given between positions $x_2$ and $x_3$.

Thus, the positions are mirrored with wrap around in case the mirrored vector exceeds the boundaries. The parameter γ is an integer multiple of 0.5 ranging from 0 to N−0.5. To obtain a mirroring process that is not biased, the parameter γ is set to N/2.

Again, the sequence of step (b) is shown for explanation reasons only and is not necessarily explicitly performed.

Further, the biased mirroring is preferably done on the input sequence, but in another preferred embodiment, the output sequence is modified instead of or in addition to the input sequence:

$$p_i = <\gamma^{in}, \gamma^{out}>_i.$$

A further preferred embodiment for obtaining distinct interleaver patterns is to use variations of the pseudo-random noise generator polynomial. It will be appreciated that the invention is preferably used for decorrelating PN interleavers (or pseudo-noise noise interleavers or pseudo-random interleavers). As already described above, in a classical block interleaver the input data is written along the rows of a set of memory elements configured as a matrix, and is then read out along the columns. The PN interleaver is a variation of the classical block interleaver in which the data is written to memory in sequential order and read out in a pseudo-random order. A random interleaver is a permutation block interleaver that is generated from a random permutation based on a random noise source. For example, a noise vector of a given length is generated and the permutation that puts the noise vector in sorted order is used to generate the interleaver. In practice, the noise vector itself may be generated by a pseudo-random noise generator.

Figure 7:
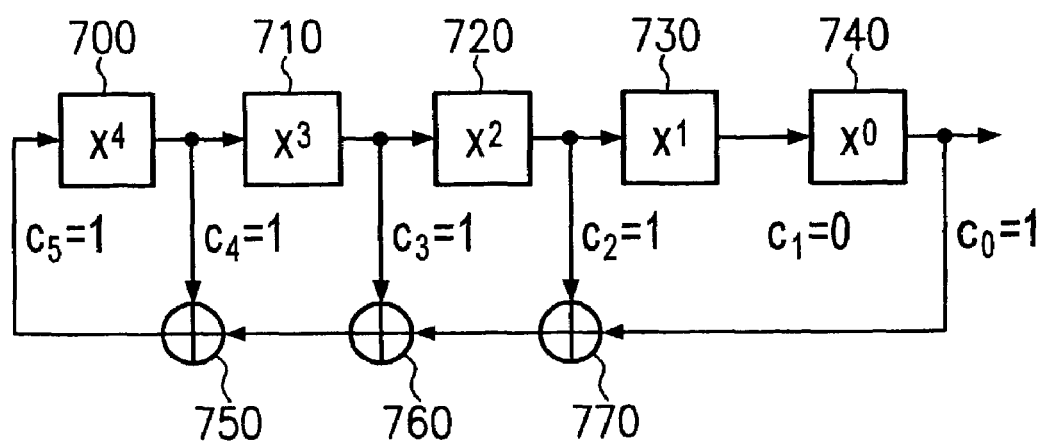
FIG. 7 depicts an LFSR than can be used with an embodiment of the present invention.

A well know technique for pseudo-random noise generators is the usage of linear feedback shift registers (LFSR), an example thereof being shown in FIG. 7. The LFSR consists of a sequence of delay elements such as D flip-flops 700, 710, 720, 730, 740 that store data values $x^j$, j=0, 1, 2, 3, 4. The stored data values are fed back to the input of the LFSR according to individual weighting factors $c_j$. Thus, the feedback can be described by a polynomial of the form $$v(x) = \sum_{j=0}^{L-1} c_j x^j$$

where L is the number of tabs, i.e. the number of stages of the LFSR. In the example of FIG. 7, the polynomial is $v(x) = x^4 + x^3 + x^2 + x^0$ since $c_1 = 0$ and $c_0 = c_2 = c_3 = c_4 = 1$.

One example of how derive a PN sequence from such a register is to use the content of each tap and interpret this as binary representation of an integer number. Alternative schemes are apparent to those of ordinary skill in the art and are therefore not discussed herein in more detail.

Thus, in the present embodiment the interleaver pattern parameters $p_i$ are unique generator polynomials that are different in each data stream:

$$p_1 = v_i(x) = \{c_j | j=0, \ldots, L-1\}_i.$$

As the period of the pseudo-random sequence should be at least N, in a preferred embodiment of the invention, there are N of the provided values used for obtaining the pseudo-random noise vector in case the pseudo-random sequence is greater than N. Preferably, the N lowest values are selected.

Further, it is preferable to choose as many different generator polynomials with the described proprieties as possible. However, for ease of implementation, those polynomials that fit the requirements with the smallest memory length L, i.e. the number of stages, are selected.

In a further preferred embodiment of the present invention, LFSRs are applied in much the same way as previously described but the interleaver pattern parameters $p_i$ indicate initialisation values of these LFSR, that are unique for each stream. It is well known that m-sequences are defined as linear feedback shift registers with L stages which produce the maximum possible period $q^L-1$ where q is set to 2 in binary LFSRs. The shift registers have to be initialised with a set value $\kappa$ where $0<\kappa<q^L$. This initialisation value has direct impact on the sequence of values with the noise vector. The value $\kappa$ is therefore used as interleaver pattern parameters $p_i$.

$$p_1=\kappa_i.$$

While in the description above several embodiments have been discussed that can be used for obtaining distinct interleaver patterns, combinations of some or all of the above described schemes can be used to increase the number of possible distinct interleavers since each parameter can be set individually and independently. This means, that the interleaver pattern parameters $p_i$, i=1, 2, 3, are multi-value tuples containing one or more cyclic shifting parameters $\pi$, $\pi^{in}$, $\pi^{out}$ and/or one or more biased mirroring parameter $\gamma$, $\gamma^{in}$, $\gamma^{out}$ and/or a unique pseudo-random noise generator polynomial $\nu$ and/or a unique initialisation value $\kappa$, e.g.

$$p_i=<\pi^{in}, \pi^{out}, \gamma^{in}, \gamma^{out}, \{c_j|j=0,\ldots,L-1\}, \kappa>_i.$$

Further, different LFSR sequence lengths L can be used. It will be appreciated that the system of the invention preferably includes mechanisms for avoiding those parameter combinations that lead to identical interleavers.

Figure 1:
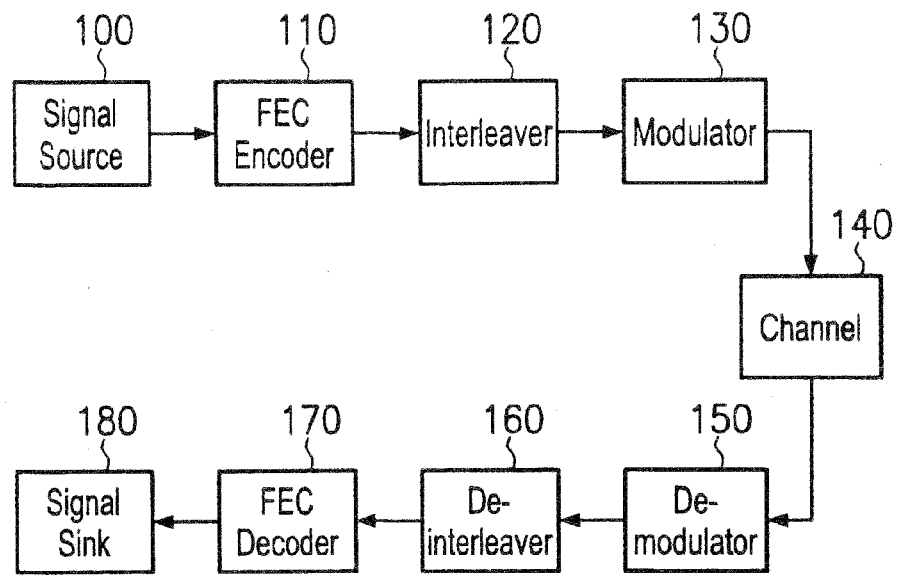
FIG. 1 depicts a communication system employing interleaving techniques.
Figure 2:
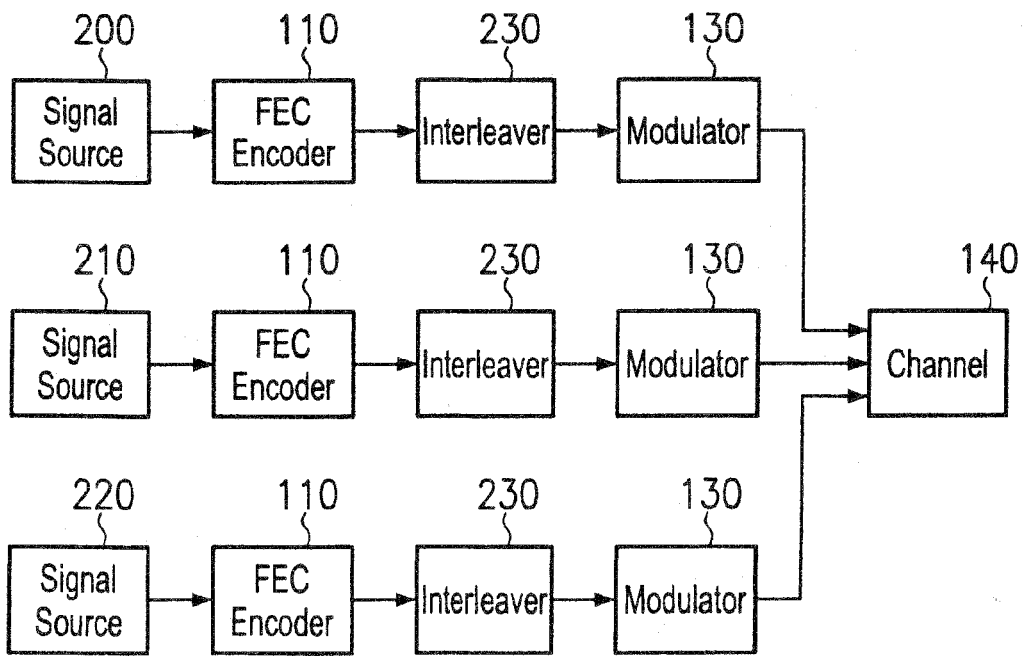
FIG. 2 illustrates the transmitter side of a communication system where data from multiple sources are conveyed on one and the same channel, according to the prior art.

Further, while in FIG. 3 the interleavers 300, 310, 320 are depicted as replacing the mother interleavers 230 of FIG. 2, it will be appreciated that the transmitters, and inversely the receivers, might include the mother interleavers 230 in addition to a modification block to obtain the distinct interleavers 300, 310, 320. Thus, it is within the invention to provide an additional block to the mother interleaver 230 for each stream, or to provide interleavers 300, 310, 320 that replace the mother interleaver 230 in each stream. Similarly, implementations can be done by adding blocks before or after the mother interleaver, or by replacing the mother interleaver with distinct interleaver blocks which explicitly follow the functionalities given above.

Moreover, in a further embodiment, the interleaver functionalities are varied with time. If the interleaver pattern parameters $p_1$, are tuples containing multiple values, the time variation can apply to each of these values or to only some of them.

If it should not be possible to avoid such parameter combinations that result to identical individual interleavers in the data streams, the parameters are preferably chosen in a manner that the number of identical interleavers is reduced to the most extent.

As will be appreciated by those of ordinary skill in the art, the technique that has been described in the foregoing allows for decorrelating interleavers for synchronised data transmission. It is well known that in a communication system that includes forward error correction (FEC) interference bursts have more impact on the decoder performance than a multitude of distributed signal errors. Therefore, the invention allows for distributing existing burs interference between two streams to less bursty or signal errors in each stream before the FEC code is decoded. This is done in the embodiments described above for instance by obtaining a multitude of PN interleavers out of a generic PN interleaver, i.e. out of the mother interleaver.

Error decorrelation using distinct interleaver patterns is particularly advantageous where the data streams do not differ from each other with respect to the code block length, spreading factor, coding rate etc. The invention is therefore in particular suitable for HSDPA with multi-code transmission within the 3GPP context.

In a CDMA system, a handy way of choosing the parameters is to use the spreading code number $\sigma$:

$$p_i=\sigma_i.$$

In the example of the 3GPP context, currently a maximum of 512 spreading codes are used simultaneously within one cell, each spreading code representing one data stream.

A particularly preferred embodiment is to use a simple relation between the interleaver pattern parameters $p_i$, in particular the shifting parameter $\pi$, and the data stream ID:

$$p_1=\pi_i=g(\text{data stream }ID)$$

where g is an arbitrary function that converts the integer data stream ID into the interleaver pattern parameter $p_i$. This function can also be applied to obtain the cyclic shift parameters $\pi^{in}, \pi^{out}$, for shifting the input or output sequence.

For the mirroring parameters $\gamma$, $\gamma^{in}$, $\gamma^{out}$, an arbitrary function h is chosen for converting the integer data stream ID into the integer multiple of 0.5 biased mirroring parameter:

$$p_i=\gamma_i=h(\text{data stream }ID)$$

Again, the function can be used for mirroring the input as well as the output sequence.

In a further preferred embodiment, the functions g and h are chosen to be the identity function, i.e.

$$p_i=\pi_1=\text{data stream ID}$$

and $$p_1=\gamma_1=\text{data stream ID}.$$

The invention claimed is:

1. A data transmitting device for transmitting data on a channel, the device for operating in a code division multiple access (CDMA) communication system for simultaneously conveying data of a plurality of data transmitting devices on one channel, the data transmitting device comprising:
   an interleaver that receives an interleaver pattern parameter, generates a respective interleaver pattern in accordance with the received parameter, and interleaves a source data stream using the generated interleaver pattern to produce an interleaved data stream; and
   a transmitter that transmits the interleaved data stream on the channel, wherein:
   the generated interleaver pattern has interleaver characteristics that differ from the interleaver characteristics of at least one other data transmitting device that simultaneously transmits data on the channel, and
   the received interleaver pattern parameter is a biased mirroring parameter that is unique for the data transmitting device and identifies a biased mirroring scheme of data elements within the interleaved data stream.

2. The data transmitting device of claim 1, wherein:

the interleaver is a pseudo-noise (PN) interleaver, and the received interleaver pattern parameter identifies a pseudo-noise generator polynomial that is unique for the data transmitting device and used to interleave the source data stream to produce the interleaved data stream.

3. The data transmitting device of claim 1, wherein:

the interleaver is a pseudo-noise (PN) interleaver, and the received interleaver pattern parameter is a pseudo-noise generator initialization value that is unique for the data transmitting device and used to generate the interleaver pattern that will interleave the source data stream to produce the interleaved data stream.

4. The data transmitting device of claim 1, wherein the received interleaver pattern parameter is a cyclic shifting parameter that is unique for the data transmitting device and identifies a cyclical shift of data elements within the interleaved data stream.

5. The data transmitting device of claim 1 wherein the generated interleaver pattern varies with time.

6. The data transmitting device of claim 1 wherein the communication system is a high-speed downlink packet access (HSPDA) system.

7. The data transmitting device of claim 1 wherein the interleaver is a block interleaver.

8. A method of transmitting data on a channel of a code division multiple access (CDMA) communication system, wherein data of a plurality of data transmitting devices are simultaneously conveyed on one channel, the method comprising:

spreading a first data stream with a first spreading code to produce a first spread stream;

spreading a second data stream with a second spreading code to produce a second spread stream;

interleaving the first spread stream with a first interleaving pattern associated with the first spreading code to produce a first interleaved stream;

interleaving the second spread stream with a second interleaving pattern associated with the second spreading code to produce a second interleaved stream; and transmitting the first and second interleaved streams on the one channel simultaneously, wherein:

the first and second interleaving patterns are different and are each selected in accordance with the spreading code applied to the corresponding data stream, and said first and second interleaving patterns are generated in accordance with an interleaver pattern parameter which is a biased mirroring parameter that is unique for said first and second interleaved streams and that identifies a biased mirroring scheme of data elements within the said first and second interleaved streams.

9. The data transmitting method of claim 8 wherein the generated interleaver pattern varies with time.

10. The data transmitting method of claim 8 wherein the communication system is a high-speed downlink packet access (HSPDA) system.

* * * * *